(12) United States Patent
Devarajan et al.

(10) Patent No.: US 9,294,112 B1
(45) Date of Patent: Mar. 22, 2016

(54) METHODS AND SYSTEMS FOR REDUCING ORDER-DEPENDENT MISMATCH ERRORS IN TIME-INTERLEAVED ANALOG-TO-DIGITAL CONVERTERS

(71) Applicant: ANALOG DEVICES, INC., Norwood, MA (US)

(72) Inventors: Siddharth Devarajan, Arlington, MA (US); Lawrence A. Singer, Wenham, MA (US); Prawal Man Shrestha, Somerville, MA (US); Pingli Huang, Santa Clara, CA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/540,515

(22) Filed: Nov. 13, 2014

(51) Int. Cl.
H03M 1/12 (2006.01)
H03M 1/06 (2006.01)
H03M 1/08 (2006.01)
H03M 1/00 (2006.01)

(52) U.S. Cl.
CPC ............ *H03M 1/121* (2013.01); *H03M 1/0604* (2013.01); *H03M 1/0607* (2013.01); *H03M 1/0609* (2013.01); *H03M 1/0612* (2013.01); *H03M 1/0836* (2013.01); *H03M 1/124* (2013.01); *H03M 1/00* (2013.01); *H03M 1/12* (2013.01)

(58) Field of Classification Search
CPC .................................. H03M 1/00; H03M 1/12
USPC .................. 341/118, 120, 155, 110, 119, 121
See application file for complete search history.

(56) References Cited

U.S. PATENT DOCUMENTS

| 6,392,575 | B1 | 5/2002 | Eklund |
| 6,542,017 | B2 | 4/2003 | Manganaro |
| 6,771,203 | B1 | 8/2004 | Nairn |
| 6,900,750 | B1 | 5/2005 | Nairn |
| 7,250,885 | B1 | 7/2007 | Nairn |

(Continued)

OTHER PUBLICATIONS

M. El-Chammas et al., "Chapter 2, Time-Interleaved ADCs—Background Calibration of Time-Interleaved Data Converters", Analog Circuits and Signal Processing, DOI 10.1007/978-1-4614-1511-4_2 © Springer Science+Business Media, LLC 2012, ISBN 978-1-4614-1510-7, 27 pages.

(Continued)

*Primary Examiner* — Joseph Lauture
(74) *Attorney, Agent, or Firm* — Patent Capital Group (57) ABSTRACT

A time-interleaved analog-to-digital converter (ADC) uses M sub-analog-to-digital converters (sub-ADCs) to, according to a sequence, sample an analog input signal to produce digital outputs. When the M sub-ADCs are interleaved, the digital outputs exhibit mismatch errors between the M sub-ADCs due to mismatches between the sub-ADCs. A more second order subtle effect is that the mismatch error for a particular digital output from a particular ADC, due to internal coupling or other such interaction and effects between the M sub-ADCs, can vary depending on which sub-ADC(s) were used before and/or after the particular sub-ADC. If M sub-ADCs are time-interleaved randomly, the mismatches between the M sub-ADCs become a function of the sub-ADC selection pattern in the sequence. The present disclosure describes mechanisms for measuring and reducing these order-dependent mismatches to achieve high dynamic range performance in the time-interleaved ADC.

24 Claims, 6 Drawing Sheets

(56) References Cited

U.S. PATENT DOCUMENTS

| | | | |
|---|---|---|---|
| 7,253,762 B2 | 8/2007 | Huang et al. | |
| 7,312,734 B2 * | 12/2007 | McNeill et al. | H03M 1/1004 341/120 |
| 7,482,956 B2 | 1/2009 | Huang et al. | |
| 8,890,729 B2 | 11/2014 | Lewis et al. | |
| 2010/0049483 A1 | 2/2010 | Johansson et al. | |
| 2011/0063149 A1 | 3/2011 | Kidambi | |
| 2014/0152478 A1 | 6/2014 | Lewis et al. | |

OTHER PUBLICATIONS

Behzad Razavi, "Problem of Timing Mismatch in Interleaved ADCs", Electrical Engineering Department, University of California, Los Angeles, ISBN 978-1-4673-1556-2/12, © 2012 IEEE, 8 pages.

Stepanovic, Dusan, "Calibration Techniques for Time-Interleaved SAR A/D Converters", Electrical Engineering and Computer Sciences University of California at Berkeley, Technical Report No. UCB/EECS-2012-225, Dec. 4, 2012, http://www.eecs.berkeley.edu/Pubs/TechRpts/2012/EECS-2012-255.html, 116 pages.

Elbornsson, J. et al., "Analysis of Mismatch Noise in Randomly Interleaved ADC System", Acoustics, Speech, and Signal Processing, 2003. Proceedings. (ICASSP '03). 2003 IEEE International Conference (vol. 6), Apr. 6-10, 2003, VI 277-80 vol. 6, ISBN 0-7803-7663-3, 5 pages (including Abstract).

Vogel, Christian et al., "A Novel Channel Randonization Method for Time-Interleaved ADCs", IMTC 2005—Instrumentation and Measurement Technology Conference, Ottawa, Canada, May 17-19, 2005, 6 pages.

Christian Vogel, *Comprehensive Error Analysis of Combined Channel Mismatch Effects in Time-Interleaved ADCs*, IMTC 2003—Instrumentation and Measurement Technology Conference, Vail, CO, USA, May 20-22, 2003, 6 pages.

Christian Vogel, Doctoral Thesis, *Modeling, Identification, and Compensation of Channel Mismatch Error in Time-Interleaved Analog-to-Digital Converters*, Faculty of Electrical Engineering and Information Technology, Graz University of Technology, Austria, Graz, Jul. 2005, 226 pages.

Ali Beydoun et al., *A Novel Digital Calibration Technique for Gain and Offset Mismatch in Parallel TΣ ΔADCs*, 978-1-4244-4296-6/10 © 2010 IEEE, ICASSP 2010, 4 pages.

Behzad Razavi, *Design Considerations for Interleaved ADCs*, IEEE Journal of Solid-State Circuits, vol. 48, No. 8, Aug. 2013, 12 pages.

Jonas Elbornsson et al., *Analysis of Mismatch Effects in Randomly Interleaved A/D Converter System*, Control & Communication, Department of Electrical Engineering, Linkopings University, Linkoping, Sweden, Mar. 3, 2003, 14 pages.

Michael Soudan et al., *Methodology for Mismatch Reduction in Time-Interleaved ADCs*, 1-4244-1342-7/07, © 2007, IEEE, 4 pages.

Christian Vogel, *The Impact of Combined Channel Mismatch Effects in Time-Interleaved ADCs*, IEEE Transactions on Instrumentation and Measurement, vol. 54, No. 1, Feb. 2005, 13 pages.

* cited by examiner

METHODS AND SYSTEMS FOR REDUCING ORDER-DEPENDENT MISMATCH ERRORS IN TIME-INTERLEAVED ANALOG-TO-DIGITAL CONVERTERS

TECHNICAL FIELD OF THE DISCLOSURE

The present invention relates to the field of integrated circuits, in particular to time-interleaved analog-to-digital converters (ADCs).

BACKGROUND

In many electronics applications, an analog-to-digital converter (ADC) converts an analog input signal to a digital output signal, e.g., for further digital signal processing or storage by digital electronics. Broadly speaking, ADCs can translate analog electrical signals representing real-world phenomenon, e.g., light, sound, temperature, electromagnetic waves, or pressure for data processing purposes. For instance, in measurement systems, a sensor makes measurements and generates an analog signal. The analog signal would then be provided to an analog-to-digital converter (ADC) as input to generate a digital output signal for further processing. In another instance, a transmitter generates an analog signal using electromagnetic waves to carry information in the air or a transmitter transmits an analog signal to carry information over a cable. The analog signal is then provided as input to an ADC at a receiver to generate a digital output signal, e.g., for further processing by digital electronics.

Due to their wide applicability in many applications, ADCs can be found in places such as broadband communication systems, audio systems, receiver systems, etc. Designing an ADC is a non-trivial task because each application may have different needs in performance, power, cost and size. ADCs are used in a broad range of applications including Communications, Energy, Healthcare, Instrumentation and Measurement, Motor and Power Control, Industrial Automation and Aerospace/Defense. As the applications needing ADCs grow, the need for fast yet accurate conversion also grows.

OVERVIEW

A time-interleaved analog-to-digital converter (ADC) uses M sub-analog-to-digital converters (sub-ADCs) to, according to a sequence, sample an analog input signal to produce digital outputs. The M sub-ADCs, operating in a time-interleaved fashion, increases the sampling speed by N times compared to the sampling speed of just one ADC. However, when the M sub-ADCs are interleaved, the digital outputs exhibit mismatch errors between the M sub-ADCs due to mismatches between the sub-ADCs. A more second order subtle effect is that the mismatch error for a particular digital output from a particular ADC, due to internal coupling or other such interaction and effects between the M sub-ADCs, can vary depending on which sub-ADC(s) were used before and/or after the particular sub-ADC. If M sub-ADCs are time-interleaved randomly, the mismatches between the M sub-ADCs become a function of the sub-ADC selection pattern in the sequence. The present disclosure describes mechanisms for measuring and reducing these order-dependent mismatches to achieve high dynamic range performance in the time-interleaved ADC.

BRIEF DESCRIPTION OF THE DRAWING

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Basics of Analog-to-Digital Converters

Analog-to-digital converters (ADCs) are electronic devices that convert a continuous physical quantity carried by an analog signal to a digital output or number that represents the quantity's amplitude (or to a digital signal carrying that digital number). An ADC is usually defined by the following application requirements: its bandwidth (the range of frequencies of analog signals it can properly convert to a digital signal), its resolution (the number of discrete levels the maximum analog signal can be divided into and represented in the digital signal), and its signal to noise ratio (how accurately the ADC can measure signal relative to the noise the ADC introduces). Analog-to-digital converters (ADCs) have many different designs, which can be chosen based on the application requirements.

Understanding Time-Interleaved ADCs

Figures 1A, 1B:
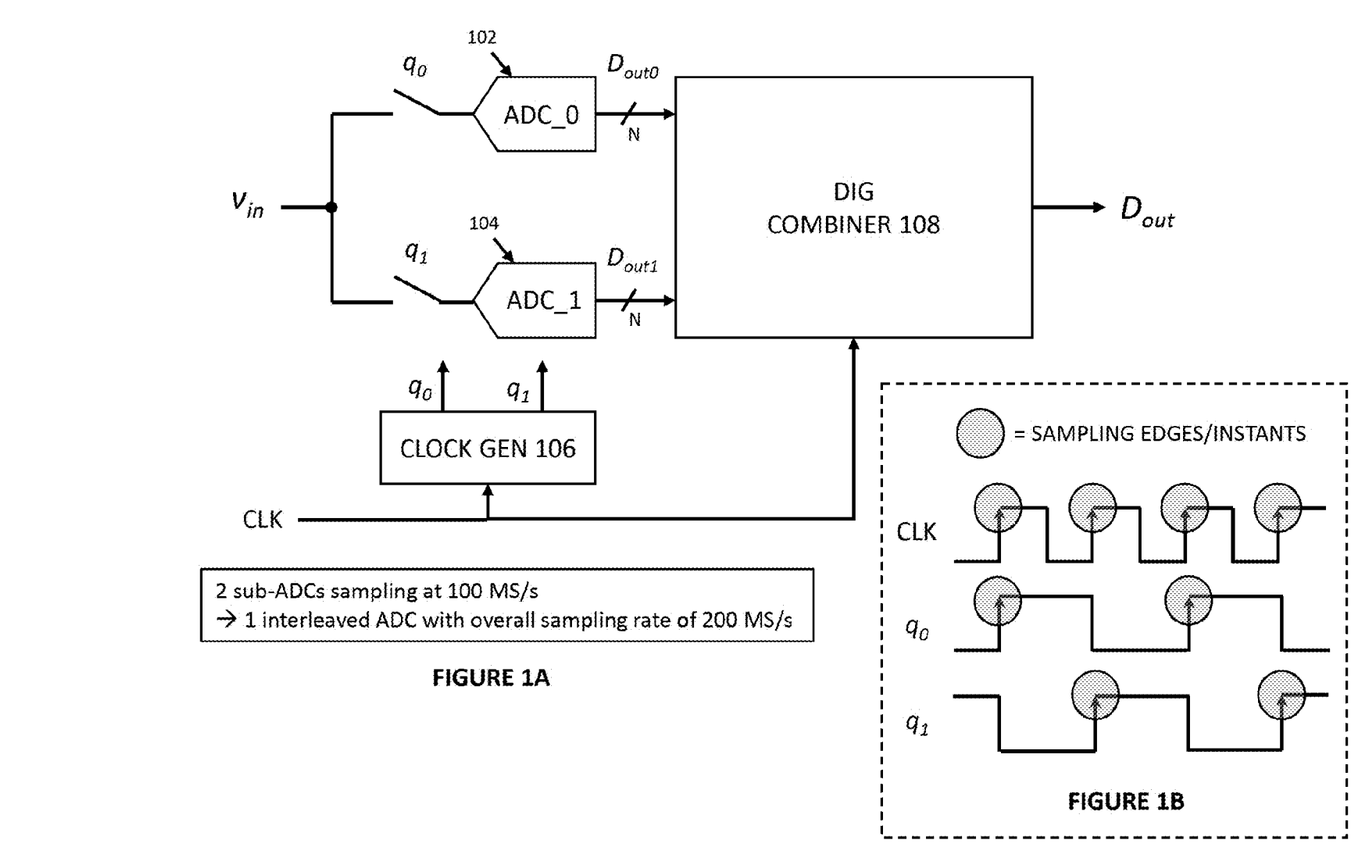
FIG. 1A shows an exemplary time-interleaved ADC having two sub-ADCs.
FIG. 1B shows a timing diagram illustrating sampling edges for the exemplary time-interleaved ADC of FIG. 1A.

Interleaving is a technique used to increase the sample rate of ADCs. Many low-speed ADCs can be used in parallel, operating in sequence in a time-interleaved fashion, using appropriate clocking to increase the effective combined ADC sampling rate. FIG. 1A shows an exemplary time-interleaved ADC having two sub-ADCs, and FIG. 1B shows a timing diagram illustrating sampling edges for the exemplary time-interleaved ADC of FIG. 1A.

In particular, FIG. 1A shows an example of a time-interleaved ADC having two sub-ADCs, ADC_0 102 and ADC_1 104, each able to produce 100 million samples per second (MS/s). Together, with appropriate clocking shown in FIG. 1B, the two sub-ADCs can provide an overall sampling rate up to 200 MS/s. The appropriate clocking can be provided by clock generator 106 to produce clock signals or selection signals, $q_0$ and $q_1$, having different phases, to alternately select a sub-ADC for converting the analog input signal to a digital output. Referring back to FIG. 1A, the two sub-ADCs, ADC_0 102 and ADC_1 104, alternately (i.e., in sequential order or according to a fixed sequence) sample the input signal $v_{in}$ and produce corresponding digital outputs, $D_{out0}$ and $D_{out1}$ respectively, which are then combined by the digital combiner 108 to produce the 200 MS/s digital output $D_{out}$. In this example, the sub-ADCs operate according to a fixed sequence of [ . . . ADC_0, ADC_1, ADC_0, ADC_1, ADC_0, ADC_1, . . . ], e.g., in a round-robin fashion.

A time-interleaved ADC having two sub-ADC is described herein as an example for understanding the operations of a time-interleaved ADC, and is not intended to be limiting to the disclosure. Other time-interleaved ADCs having more than two sub-ADCs are envisioned by the disclosure.

Mismatches Between Sub-ADCs of a Time-Interleaved ADC

While interleaving is a useful technique to achieve higher sampling speed, interleaving suffers from the drawback that any mismatches in properties like offset, gain, sampling bandwidth, or sample time skew between the two sub-ADCs causes significant degradation in overall ADC performance metrics like linearity (or spurious free dynamic range (SFDR)) and signal-to-noise-and-distortion-ratio (SNDR). These types of mismatch errors can be digitally estimated using appropriate algorithms. Once estimated, the mismatch errors can be compensated in the analog domain or corrected in the digital domain.

Figure 2:
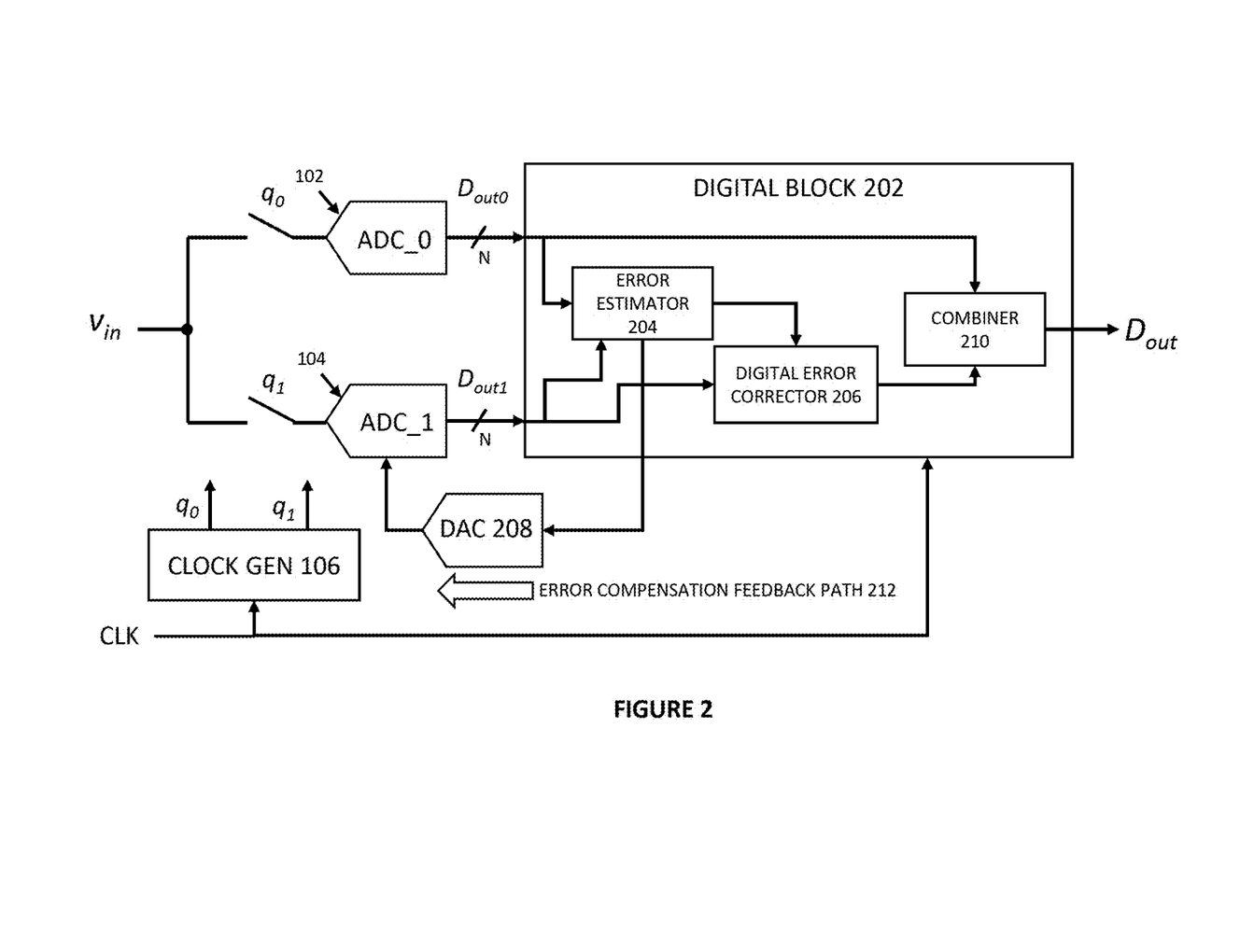
FIG. 2 shows an exemplary time-interleaved ADC with error calibration mechanisms.

FIG. 2 shows an exemplary time-interleaved ADC with error calibration mechanisms. Within the context of this disclosure, error calibration or reduction involves estimating errors, compensating for the errors in the analog domain, and/or correcting for the errors in the digital domain. Within the context of the disclosure, errors are "compensated" in the analog domain, and errors are "corrected" in the digital domain. In this example, the digital block 202 of the time-interleaved ADC includes an error estimator 204 and a combiner 208. Furthermore, the time-interleaved ADC may include a digital error corrector 206 and/or an error compensation feedback path 212.

The error calibration mechanisms of the time-interleaved ADC shown in FIG. 2 can be configured to calibrate or drive ADC_1 104 to match ADC_0 102. Typically, the error estimator 204 can estimate a mismatch between sub-ADCs by statically measuring differences between the digital outputs (or averaged versions of the digital outputs). Accordingly, the error estimator 204 can measure the mismatch between ADC_0 102 and ADC_1 104 based on the digital outputs from the two sub-ADCs.

After estimating the mismatch, the error estimator 204 or some other component can determine an error coefficient usable for reducing the estimated mismatch. One calibration technique involves a digital error corrector 206, which takes an error coefficient from the error estimator 204, and digitally adjusts the value of the digital output of, e.g., ADC_1 104 to reduce the mismatch error. Another calibration technique involves converting the error coefficient into an analog value via feedback digital-to-analog converter (DAC) 208, e.g., in the form of a voltage, current, or charge DAC adjustment, and injecting the analog value, or some other appropriate compensation quantity into the analog domain, e.g., ADC_1 104, via the error compensation feedback path 212. The error estimator 204 effectively reduces the mismatch by controlling the analog section (i.e., the sub-ADCs) through the error compensation feedback path 212. Through either or both of these techniques, the digital output of ADC_1 104 can be adjusted to match the output of ADC_0 102 using one or more appropriate error coefficients.

The digital outputs including, e.g., the digital outputs of ADC_0 102 and the calibrated digital outputs of ADC_1 104, are then combined digitally using combiner 210 to construct the (final) digital output $D_{out}$.

While the above error calibration techniques are described in relation to an interleaved ADC having two sub-ADCS, the error calibration techniques are also applicable for interleaved ADCS having three or more sub-ADCs. Furthermore, while the above error calibration techniques chose ADC_0 102 as the reference sub-ADC from which mismatch is estimated or measured, other sub-ADCs can also be chosen as the reference sub-ADC.

Figure 4A:
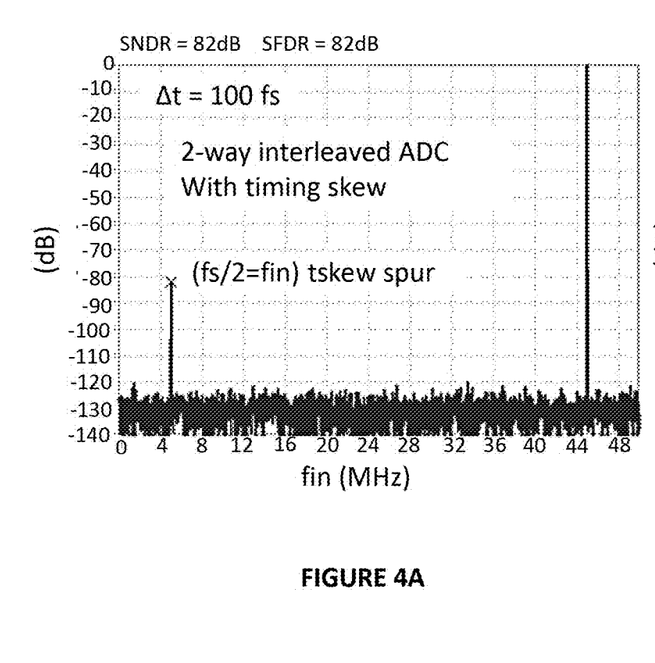
FIG. 4A shows an exemplary plot of the frequency spectrum of a time-interleaved ADC having two sub-ADCs.

The type of sequential interleaving shown in FIGS. 1A and 2 suffers from the property that any remaining mismatch errors after error calibration, which are inevitable, still show up in the ADC frequency spectrum (e.g., a spectrum generated by a Fast Fourier Transform) as spurs in discrete frequency bins with large concentrated energy content. This spur is observable in FIG. 4A, which shows an exemplary plot of the frequency spectrum of a time-interleaved ADC having two sub-ADCs, where one of the sub-ADCs has a timing skew of 100 femtoseconds. A spur is present, with a label "tskew spur". This is undesirable for many applications, and can significantly affect the performance of the time-interleaved ADC.

Randomized Time-Interleaved ADCs

Figure 3:
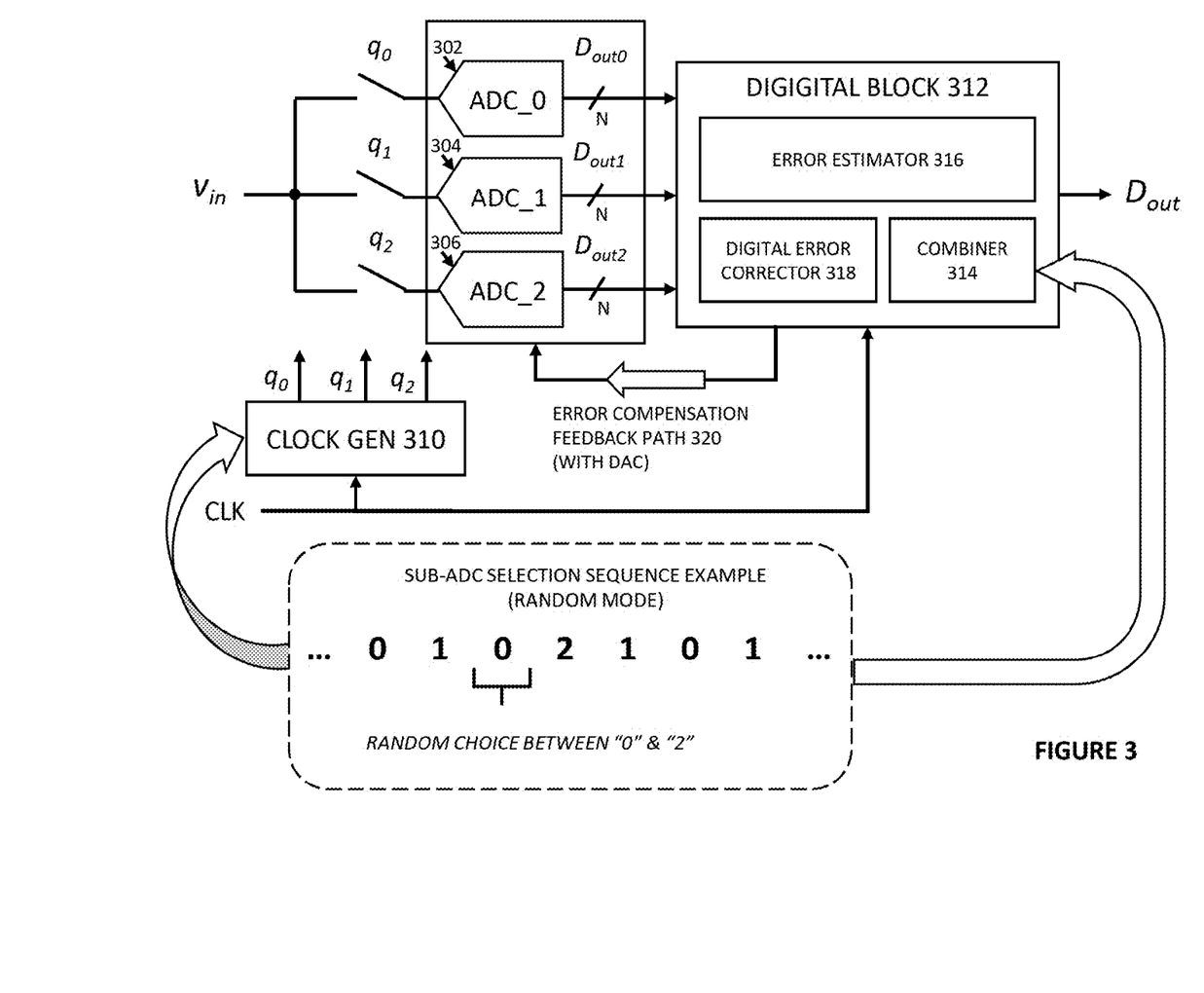
FIG. 3 shows an exemplary randomized time-interleaved ADC having three sub-ADCs.

One solution to reducing the above-mentioned spurs is to add an additional sub-ADC and randomize the sub-ADC selection patterns. FIG. 3 shows an exemplary randomized time-interleaved ADC having three sub-ADCs: ADC_0 302, ADC_1 304, ADC_2 306. By adding an additional sub-ADC, e.g., ADC_2 306, the sub-ADC selection or the sequence in which the sub-ADCs sample the analog input and produce digital outputs can be randomized, or at least pseudo-randomized. An exemplary sub-ADC selection sequence in random mode is shown in FIG. 3. The sequence includes selecting sub-ADCs in the following exemplary order: ADC_0 302, ADC_1 304, ADC_0 302, ADC_2 306, ADC_1 304, ADC_0 302, and ADC_1 304. The pseudo-randomized sequence is generated or chosen based on an exemplary sub-ADC selection rule. The rule defines that if a sub-ADC is selected, it cannot be selected immediately after; of the (two) remaining sub-ADC choices, one is chosen randomly. This rule produces pseudo-randomization. As seen in the sample, when ADC_1 304 was chosen, the sub-ADC immediately after ADC_1 304 is selected randomly between ADC_0 302 and ADC_2 306.

Based on the sequence, the clock generator 310 generates appropriate clocking/selection signals, $q_0$, $q_1$, and $q_2$, to cause the sub-ADCs to sample the analog signal $v_{in}$ and produce digital outputs $D_{out1}$, $D_{out2}$, $D_{out3}$ according to the pseudo-randomized sequence. The digital block 312 can provide a combiner 314 which combines the digital outputs $D_{out1}$, $D_{out2}$, $D_{out3}$ in accordance with the pseudo-randomized sequence. For instance, information associated with the sequence can be provided to the combiner 314 in the digital block 312 to combine the digital outputs properly. The digital block 312 may also include an error estimator 316 to estimate the mismatches between the sub-ADCs. Depending on the implementation, the digital block 312 may include a digital error corrector 318 which reduces the mismatch error by applying an error coefficient provided by the error estimator 316 to the digital outputs. In some embodiments, the error coefficient is injected or applied into the analog domain via error compensation feedback path 320 (which is implied to include a DAC).

Figure 4B:
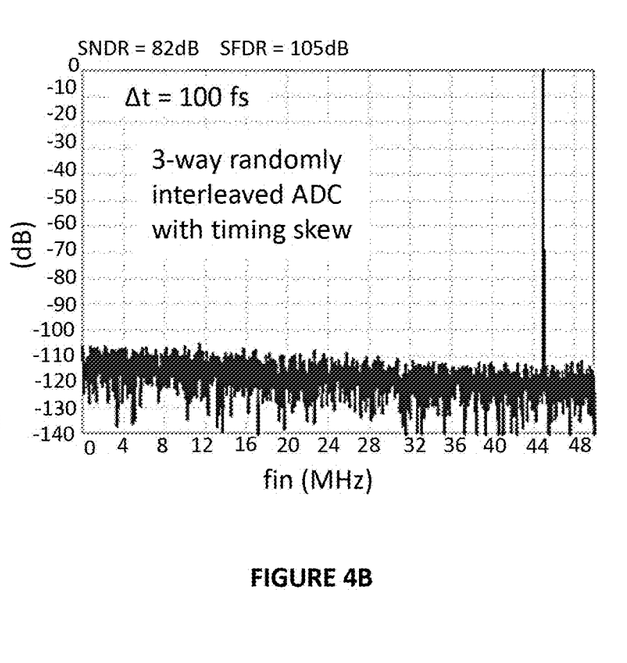
FIG. 4B shows an exemplary plot of the frequency spectrum of a time-interleaved ADC having three sub-ADCs.

Pseudo-randomization helps spread the discrete mismatch error tones in the final $D_{out}$ ADC spectrum. The discrete tones (spurs) would have been present if the selection was sequential, e.g., where the sub-ADCs are used according to a fixed sequence. Through pseudo-randomization, the discrete tones are spread into the noise floor as seen in FIG. 4B, which shows an exemplary plot of the frequency spectrum of a time-interleaved ADC having three sub-ADCs where one of the sub-ADCs has a timing skew of 100 femto seconds. Due to the pseudo-random nature of the selection, the noise floor is not "white", but slightly "colored".

Order-Dependent Mismatch Errors

While at first glance the idea of randomizing the sub-ADC selection seems highly desirable, it comes with an important second order problem. The mismatches between the sub-ADCs tend to be dynamic due to coupling factors between the sub-ADCs. This is because the time-interleaved sub-ADCs do not operate completely independently from each other.

To better understand the coupling factors, consider an example of a time-interleaved ADC having four sub-ADCs operating in random mode. When the sub-ADCs are time-interleaved, each of them can be in one of four states for a given cycle: track state, compare state, hold state, and wait state. Track state is when the sub-ADC is sampling the analog input signal. Compare state is when the comparators in the sub-ADC are producing a result. Hold state is when the results are held and a digital output is produced (i.e., digital output is read out when the sub-ADC is in hold state). Wait state is when the sub-ADC is waiting. The following table illustrates an example where the sub-ADCs has sequence of [ . . . ADC_3, ADC_2, ADC_0, ADC_1, ADC_2, ADC_0, ADC_3, . . . ] (corresponding to the sequence of sub-ADCs providing a digital output, i.e., in the order shown by the column "Hold State").

| Cycle | Track State | Compare State | Hold State | Wait State |
|---|---|---|---|---|
| 1 | ADC_0 | ADC_2 | ADC_3 | ADC_1 |
| 2 | ADC_1 | ADC_0 | ADC_2 | ADC_3 |
| 3 | ADC_2 | ADC_1 | ADC_0 | ADC_3 |
| 4 | ADC_0 | ADC_2 | ADC_1 | ADC_3 |
| 5 | ADC_3 | ADC_0 | ADC_2 | ADC_1 |
| 6 | ADC_2 | ADC_3 | ADC_0 | ADC_1 |
| 7 | ADC_1 | ADC_2 | ADC_3 | ADC_0 |

When the digital output is read from a sub-ADC in the hold state, the digital output could potentially be affected by the sub-ADC in track state, the sub-ADC in the compare state, and the sub-ADC in the wait state. For example, for cycle #5, the mismatch present for the digital output from ADC_2 in the hold state can be affected by any one or more of the other sub-ADCs in other states, i.e., ADC_3 in track state, ADC_0 in compare state, and ADC_1 in wait state. Moreover, the possible sub-ADCs for a given state can affect the digital output from ADC_2 differently. For instance, when the sub-ADC in the track state has a significant impact on the mismatch of the sub-ADC in the hold state, the mismatch can depend on which sub-ADC is in the track state for a given sub-ADC in the hold state. In this particular example, for a given sub-ADC in hold state, there are three possible sub-ADCs can be in the track state each making a different contribution to the mismatch of the given sub-ADC. For a time-interleaved ADC having four sub-ADCs, to account for the effect of the three possible sub-ADC in the track state, error calibration mechanisms may need to estimate 3×4=12 separate mismatches and correct for those mismatches using 12 separate coefficients.

Note that when a particular sub-ADC is the track state, that particular sub-ADC goes to the hold state after two clock cycles. In other words, this observed effect can be described as an order-dependent effect—order-dependent mismatch between sub-ADCs. For example, the sub-ADC in the hold state is being affected by the sub-ADC that would be in the hold state two cycles later. Phrased differently, a digital output provided by a given sub-ADC is affected by the sub-ADC which has a position that is two positions after the position of the given sub-ADC in the sequence (referred herein simply as "two after").

Not only each sub-ADC has a mismatch with respect to one or more other sub-ADCs, the mismatch further depends on which one or more sub-ADC(s) are before and/or after the given sub-ADC. Generally speaking, the order dependent errors can be present for any time-interleaved ADC having three or more sub-ADCs. Accordingly, the mismatch may need to be corrected based on a pattern of sub-ADCs. This order-dependent effect can be attributed to coupling effects such as substrate coupling, supply bounce, sample time modulation or reference bounce, and so forth. Furthermore, the mismatch error can include one or more of the following: offset error, gain error, timing skew error, bandwidth error, integral non-linearity error, and differential non-linearity error.

While the above example discusses an order-dependent effect by a sub-ADC that is "two after" the given sub-ADC, this order-dependent effect can be observed for any of the sub-ADC(s) before and/or after the sub-ADC. The effect is usually dependent on the particular hardware implementation and layout of the circuits which make up the time-interleaved ADC, and the effect can be determined empirically and/or through simulations and calculations.

The mismatch errors in the sub-ADCs vary depending on the order information associated with a digital output generated by a current sub-ADC, i.e., specifying a pattern of sub-ADC(s) that were selected before and/or after a particular sub-ADC that produced a given digital output. In some embodiments, the order information indicates at least one of the plurality of sub-ADCs having a position in the sequence preceding a position of the current sub-ADC in the sequence. For example, the mismatch of ADC_2 could change depending on whether ADC_1 came before it or ADC_0 came before it. In some embodiments, the order information indicates at least one of the plurality of sub-ADCs having a position in the sequence after a position of the current sub-ADC in the sequence. In another example, the mismatch of ADC_2 could change depending on whether ADC_1 came two positions after it or whether ADC_0 came two positions after it (while not change depending on the sub-ADC that came one position after it). In some embodiments, the order information indicates at least one of the plurality of sub-ADCs having a position in the sequence after a position of the current sub-ADC in the sequence, and at least one of the plurality of sub-ADCs having a position in the sequence after a position of the current sub-ADC in the sequence. In yet another example, the mismatch of ADC_2 could (1) change depending on whether ADC_1 came one position before it or whether ADC_0 came one position before it, and (2) change depending on whether ADC_1 came two positions after it or whether ADC_0 came two position after it (while not change depending on the sub-ADC that came one position after it). Order-dependent error could extend to as little as one sample before and/or after to any one or more of the many samples before and/or after depending on the particular circuit implementation.

Through improved error calibration which takes these order-dependent mismatch errors into account, a randomized time-interleaved ADC can achieve higher overall performance, such as improved linearity (or SFDR) and improved SNDR.

Figure 5:
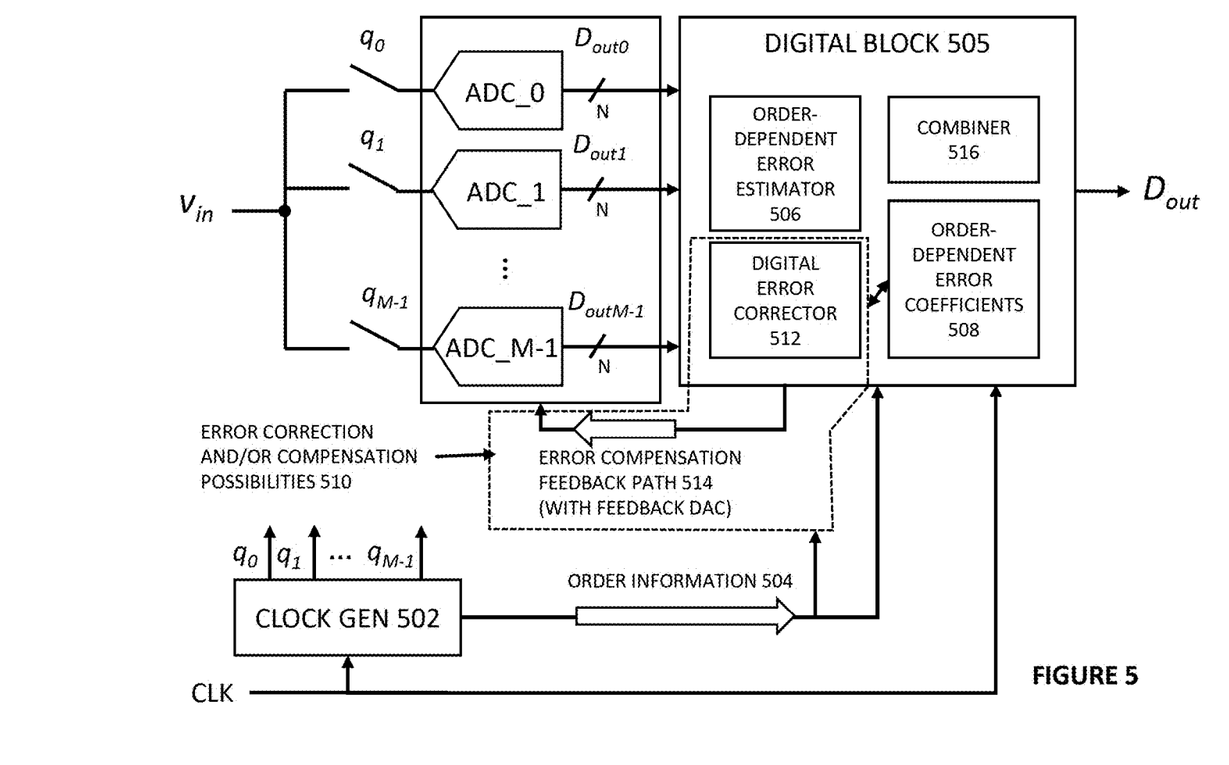
FIG. 5 shows an illustrative time-interleaved ADC with improved order-dependent error calibration mechanisms, according to some embodiments of the disclosure.

Exemplary Time-Interleaved ADC Configured with Parts for Reducing Order-Dependent Mismatch Errors FIG. 5 shows an illustrative time-interleaved ADC with improved order-dependent error calibration mechanisms, according to some embodiments of the disclosure. The system diagram shown is generalized for a time-interleaved ADC having M sub-ADCs (ADC_0, ADC_1, ADC_M−1). Specifically, the time-interleaved ADC includes M sub-ADCs for sampling an analog input signal $v_{in}$ and produce digital outputs $D_{out0}$, $D_{out1}$, ... $D_{outM-1}$ according to a sequence. The sequence may correspond to a pseudo-random sequence, and the time-interleaved ADC may be a randomized time-interleaved ADC. The M sub-ADCs can include three or more sub-ADCs configured to, in any chosen/selected/prescribed sequence, sample the analog input signal and produce digital outputs. When there are three or more sub-ADCs, the randomization in the sequence leads to several possible patterns for a digital sample from a given sub-ADC, making mismatch errors dependent on the pattern.

Similar to the time-interleaved ADCs shown in FIGS. 2 and 3, digital block 505 or other parts of the time-interleaved ADC is provided with various parts for providing error calibration and combining functions. For instance, the digital block 505 includes a combiner 516, which operates similarly to the combiner 314 of FIG. 3. Tailored to reducing order-dependent errors, the time-interleaved ADC has special parts, which can include an order-dependent error estimator 506, order-dependent error coefficients block 508, and error correction and/or compensation possibilities 510 (sometimes referred to as "error correction and/or compensation part"). The special parts are specially designed and provided to reduce order-dependent mismatch errors.

To correct for the order-dependent mismatch errors, the error estimator 506 can measure/estimate order-dependent mismatch errors. For instance, the measured mismatch error of the current sub-ADC is measured with respect to one or more other sub-ADCs in the plurality of ADCs. Furthermore, the measurement of the mismatch errors takes into account which sub-ADC(s) came before and/or after a given sub-ADC, and measures those mismatch errors separately. The method for measurement is described in further detail in relation to FIG. 6.

The order-dependent errors measured by the error estimator 506 can be converted into corresponding error coefficients suitable for reducing the measured order-dependent mismatch errors. These error coefficients for the order-dependent mismatch errors can be maintained in order-dependent error coefficients block 508. The error coefficients can be organized not only based on the current sub-ADC (a given sub-ADC), it can also be organized based on order information. In other words, the error coefficients can separately be associated with a particular pattern of sub-ADC(s) that were selected before and/or after the current sub-ADC. Depending on the implementation, the order dependent error coefficients block 508 may store order-dependent error coefficients based on any one or more samples before and/or after a given sub-ADC, according to exemplary patterns such as ["three-before" and "one-after"], ["one before" and "one after"], ["two before"], or ["two before", "one before", and "one after"], etc. Accordingly, data structures or logic being used to store such order-dependent error coefficients can differ in size and organization depending on the implementation.

To obtain the proper error coefficient for a current sub-ADC having a particular pattern, the clock generator 502 not only generates the clocking/selection signals $q_0, q_1, \ldots q_{M-1}$ according to the (pseudo-randomized) sequence, the clock generator 502 can further provide order information 504 to digital block 506 to allow mismatch errors to be reduced on the basis of the order information 504.

The time-interleaved ADC can include any one or more parts shown as error correction and/or compensation possibilities 510, which may utilize one or more techniques to perform error correction and/or compensation based on the order information 504. In some embodiments, the error correction and/or compensation possibilities 510 can determine (receive or obtain) order information 504 associated with a particular digital output from a particular sub-ADC of the plurality of sub-ADCs, and determine (receive or obtain) an order-dependent error coefficient associated with the particular digital output based on the order information 504. The order-dependent error coefficient block 508 can determine (receive or obtain) the order information 504 associated with the particular digital output from a particular sub-ADC. Then, the order-dependent error coefficient block 508 can determine (receive or obtain) a particular order-dependent error coefficient corresponding to the order information associated with the particular sub-ADC. The order-dependent error coefficient block 508 can then output the particular order-dependent error coefficient for the error correction and/or compensation possibilities 510.

Error correction and/or compensation using the order-dependent error coefficient can be done in one or more ways. One error correction technique involves a digital error corrector 512, which takes the order-dependent error coefficient from the order-dependent error coefficients block 508, and digitally adjusts the value of the digital output of the current sub-DAC to reduce the order-dependent mismatch error. In some embodiments, performing error correction of the particular digital output using the particular order-dependent error coefficient comprises adjusting the particular digital output by the particular order-dependent error coefficient to correct for order-dependent errors. One error compensation technique involves converting the order-dependent error coefficient into an analog value via an error compensation feedback path 514 to reduce or compensate the order-dependent error in the analog domain. The error compensation feedback path 514 may have a feedback digital-to-analog converter (DAC) to inject the analog value or some other appropriate compensation quantity into the analog domain in the form of a voltage, current, or charge DAC adjustment. In some embodiments, performing error compensation of the particular digital output using the particular order-dependent error coefficient comprises adjusting a coefficient of the particular sub-ADC to compensate for order-dependent errors in the analog domain.

Exemplary Method for Order-Dependent Error Mismatch Measurement or Estimation

Figure 6:
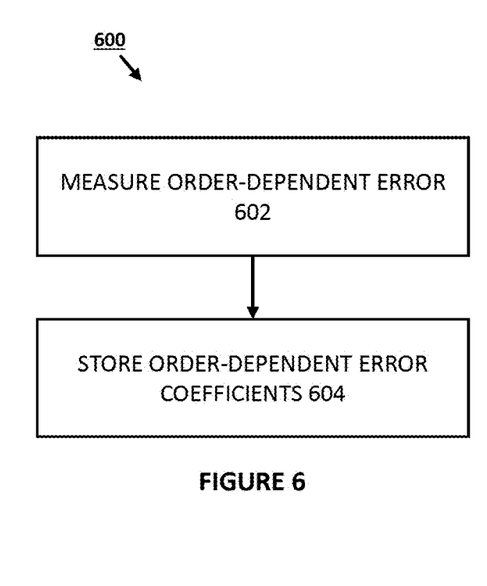
FIG. 6 is a flow diagram illustrating a method for measuring and storing order-dependent error coefficients, according to some embodiments of the disclosure.

FIG. 6 is a flow diagram illustrating a method for measuring and storing order-dependent error coefficients, according to some embodiments of the disclosure. The method 600 includes measuring order-dependent errors (box 602) and storing the order dependent error coefficients (box 604). The measurement can be performed by an order-dependent error estimator (e.g., order-dependent error estimator 506 of FIG. 5). In some cases, the measurement can be performed in the "foreground" by taking the ADC offline and applying a predetermined input. In some cases, the measurement can be performed in the "background" by measuring and comparing the digital outputs from the sub-ADCs, which are statically expected to match over long periods of time if no mismatch errors are present. For a given sub-ADC, the mismatches for the different patterns can be measured. Measurements can be made by finding differences in the averaged digital outputs between sub-ADCs. The measurements can be repeated for any patterns of interest associated with a given sub-ADC, and the measurements can be repeated for any sub-ADCs of interest.

Based on these measurements, corresponding order-dependent error coefficients can be determined. The order-dependent error coefficients dependent on the given sub-ADC from which the digital output is produced and the pattern can be maintained in an appropriate data structure and stored in memory, such as order-dependent error coefficients block 508 of FIG. 5. In some embodiments, the order-dependent error coefficients can be periodically, from time to time, or as needed, be updated in the background to track any temperature, supply, clock rate, and/or other environmental and system variations.

Exemplary Method for Reducing Order-Dependent Errors

Figure 7:
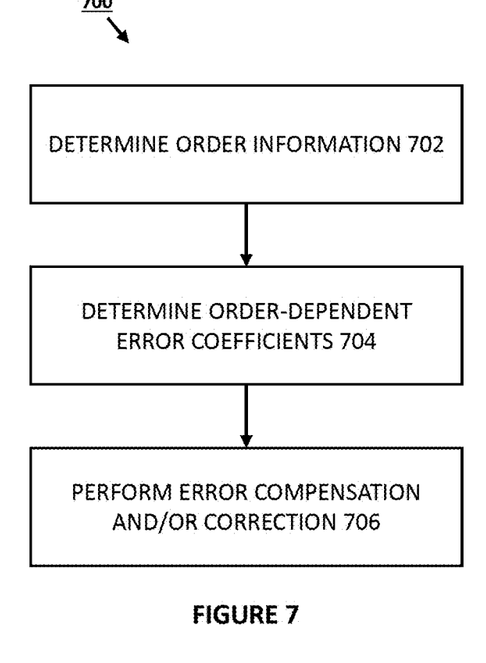
FIG. 7 is a flow diagram illustrating a method for reducing order-dependent errors of a time-interleaved ADC, according to some embodiments of the disclosure.

FIG. 7 is a flow diagram illustrating a method for reducing order-dependent errors of a time-interleaved ADC, according to some embodiments of the disclosure. The time-interleaved analog-to-digital converter (ADC) would include a plurality of sub-ADCs able to, according to a sequence, sample an analog input signal and produce digital outputs. The method includes determining (receiving or obtaining) a first order information associated with a first digital output from a first sub-ADC of the plurality of ADCs (box 702). Furthermore, the method includes obtaining a first order-dependent error coefficient associated with the first digital output based on the first order information (box 704). In some embodiments, obtaining the first order-dependent error coefficient comprises determining an order-dependent error coefficient corresponding to the first order information associated with the first sub-ADC. Moreover, the method include performing error compensation and/or correction using the first order-dependent error coefficient (box 706). The method 700 for error calibration can be performed by any suitable component (e.g., order-dependent error estimator 506, order-dependent error coefficients block 508, digital error corrector 512, error compensation feedback path 514 of FIG. 5, etc.). In some embodiments, error compensation and/or correction can include, using the order-dependent error coefficients, compensating for the errors in the analog domain, and/or correcting for the errors in the digital domain. By performing the method 700, mismatch errors can be reduced based on order information, and the overall performance of a randomized time-interleaved ADC is improved over a randomized time-interleaved ADC which does not take the order information into account.

The same method can be applied to other digital outputs dependent on the order information associated with the other digital outputs generated by the same or different sub-ADC. For instance, the method can further include determining (receiving or obtaining) a second order information associated with a second digital output from a second sub-ADC (or the first sub-ADC) of the plurality of sub-ADCs, wherein the second order information is different from the first order information. The first order information and second order information allows order-dependent mismatch errors to be appropriately compensated (different order suggests a different coefficient is to be used to compensate or correct the error). The method further includes obtaining a second order-dependent error coefficient associated with the second digital output based on the second order information. Using the second order-dependent error coefficient, the method can include performing error compensation and/or correction.

Exemplary Mathematical Formulation of Order-Dependent Offset Mismatch Error Calibration Broadly speaking, the estimation and calibration/correction of interleaving mismatch errors in a randomly interleaved ADC can be provided by appropriate binning or sorting of each sub-ADC's mismatch coefficients based on order information which specifies one or more sub-ADCs either before and/or after a given sub-ADC that produced a particular digital output. Consider, for example, the case of the three randomly interleaved sub-ADCs. If the mismatch of ADC_0 can be different depending on whether ADC_1 or ADC_2 sampled before ADC_0, then ADC_0 would have two order-dependent error coefficients instead of just one.

In one example, the offset mismatch of any sub-ADC can be determined by averaging the digital output of that sub-ADC for a long time. So, in the 3-way randomly interleaved example, average digital outputs can be obtained:

Average output of ADC_0=OS_ADC_0=AVE(Dout0)
Average output of ADC_1=OS_ADC_1=AVE(Dout1)
Average output of ADC_2=OS_ADC_2=AVE(Dout2)

Then, one can calibrate the time-interleaved ADCs by forcing ADC_1 and ADC_2 to match ADC_0 (which is chosen arbitrarily as the "reference" sub-ADC) with either a simple digital subtraction or with some type of DAC feedback into the analog domain using an appropriate order-dependent error coefficient. This process would compensation or correct for offset mismatch errors. Arbitrarily selecting OS_ADC_0 (i.e. ADC_0) as the reference, the calibration can be expressed as:

Dout0=Dout0
Dout1=Dout1−(OS_ADC_1−OS_ADC_0), where OS_ADC_1−OS_ADC_0 characterizes the mismatch between ADC_1 and reference ADC_0
Dout2=Dout2−(OS_ADC_2−OS_ADC_0), where OS_ADC_2−OS_ADC_0 characterizes the mismatch between ADC_2 and reference ADC_0

However, if the 3-way randomly interleaved system is affected by order-dependent mismatch errors, and assuming the dominant order-dependent error is caused by the sub-ADC that preceded the current sub-ADC, each sub-ADC would have two mismatch coefficients as shown below to compensate/correct the offset mismatch error.

Average output of ADC_0 when preceded by ADC_1=OS_ADC0_1=Ave(Dout0_1), where Dout0_1 is Dout0 when ADC_0 is preceded by ADC_1
Average output of ADC_0 when preceded by ADC_2=OS_ADC0_2=Ave(Dout0_2), where Dout0_2 is Dout0 when ADC_0 is preceded by ADC_2
Average output of ADC_1 when preceded by ADC_0=OS_ADC1_0=Ave(Dout1_0), where Dout1_0 is Dout1 when ADC_1 is preceded by ADC_0
Average output of ADC_1 when preceded by ADC_2=OS_ADC1_2=Ave(Dout1_2), where Dout1_2 is Dout1 when ADC_1 is preceded by ADC_2
Average output of ADC_2 when preceded by ADC_0=OS_ADC2_0=Ave(Dout2_0), where Dout2_0 is Dout2 when ADC_2 is preceded by ADC_0
Average output of ADC_2 when preceded by ADC_1=OS_ADC2_1=Ave(Dout2_1), where Dout2_1 is Dout2 when ADC_2 is preceded by ADC_1

Thus, each sub-ADC digital output is adjusted by one of the six mismatches measured above, depending on the pattern that produced it. Of these six sub-ADC configurations any one can be arbitrarily made the "reference", and the other five mismatches would be made equal to the reference either with a digital subtraction or with some type of DAC feedback into the analog domain. Arbitrarily selecting OS_ADC0_1 (i.e. ADC_0 when preceded by ADC_1) as the reference, the order-dependent mismatch can be defined with respect to OS_ADC0_1 by taking the average output of a given sub- ADC having a particular pattern and subtracting the average output by OS_ADC0_1. Accordingly, the calibration can be mathematically expressed as:

Dout0_1=Dout0_1
Dout0_2=Dout0_2−(OS_ADC0_2−OS_ADC0_1)
Dout1_0=Dout1_0−(OS_ADC1_0−OS_ADC0_1)
Dout1_2=Dout1_2−(OS_ADC1_2−OS_ADC0_1)
Dout2_0=Dout2_0−(OS_ADC2_0−OS_ADC0_1)
Dout2_1=Dout2_1−(OS_ADC2_1−OS_ADC0_1)

The same formulation can be extended to other patterns, depending on the implementation. For instance, more coefficients can be measured for a variety of patterns of interest. Arbitrarily selecting one average output of a sub-ADC having a particular pattern as the reference, order-dependent offset mismatches can be defined with respect to the reference average output. For instance, the offset mismatch can be defined as the difference between the average output of a given sub-ADC having a particular pattern and the reference average output.

It is envisioned by the disclosure that the various types of mismatches can be measured, using the same or different formulations. Other mismatches can include (besides offset mismatch as described above), but are not limited to, including timing skew mismatch, gain mismatch, sample bandwidth mismatch, etc.

The above examples illustrate some possible ways of providing order-dependent error coefficients and using the order-dependent error coefficients to reduce order-dependent mismatch errors, and are not intended to be limiting to the present disclosure. In some cases, if a feedback path is provided to reduce the mismatch errors, the formulation may be defined differently. The sorting and binning type algorithm explained above is only one of many possible implementations of how to correct for order dependent mismatch errors. It is understood that other possible algorithms suitable for this purpose are also envisioned by the disclosure.

Variations and Implementations

Note that the activities discussed above with reference to the FIGURES are applicable to any integrated circuits that involve processing analog signals and converting the analog signals into digital data using a plurality of ADCs. In certain contexts, the features discussed herein related to a high-speed ADC, i.e., the time-interleaved ADC, can be applicable to medical systems, scientific instrumentation, wireless and wired communications systems (especially systems requiring a high sampling rate), radar, industrial process control, audio and video equipment, instrumentation, and other systems which uses ADCs.

The level of performance offered by time-interleaved ADCs can be particularly beneficial to products and systems in demanding markets such as medical imaging, precise and high speed medicine dispensers (fluid flow measurement), synthetic aperture radar, digital beam-forming communication systems, and advanced test/measurement systems (oscilloscopes). Moreover, certain embodiments discussed above can be provisioned in technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind). Furthermore, powertrain systems (for example, in hybrid and electric vehicles) can use high-speed and high-precision data conversion products in battery monitoring, control systems, reporting controls, maintenance activities, etc.

In yet other example scenarios, the teachings of the present disclosure can be applicable in the industrial markets that include process control systems that help drive productivity, energy efficiency, and reliability. In consumer applications, the teachings of the signal processing circuits discussed above can be used for image processing, auto focus, and image stabilization (e.g., for digital still cameras, camcorders, etc.). Other consumer applications can include audio and video processors for home theater systems, DVD recorders, and high-definition televisions. Yet other consumer applications can involve advanced touch screen controllers (e.g., for any type of portable media device). Hence, such technologies could readily part of smartphones, tablets, security systems, PCs, gaming technologies, virtual reality, simulation training, etc.

In the discussions of the embodiments above, the parts and components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure.

Parts of various apparatuses for reducing order-dependent mismatch errors can include electronic circuitry to perform the functions described herein. In some cases, one or more parts of the apparatus can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed signal domain. In some instances, the processor may be configured to carrying out the functions described herein by executing one or more instructions stored on a non-transitory computer medium.

In one example embodiment, any number of components of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the components of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the error calibration functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components or parts. However, this has been done for purposes of clarity and example only. It should be appreciated that the system can be consolidated in any suitable manner. Along similar design alternatives, any of the illustrated components, modules, blocks, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to reducing order-dependent mismatch errors, illustrate only some of the possible functions that may be executed by, or within, systems illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. Note that all optional features of the apparatus described above may also be implemented with respect to the method or process described herein and specifics in the examples may be used anywhere in one or more embodiments.

What is claimed is:

1. A method for reducing order-dependent errors of a time-interleaved analog-to-digital converter comprising a plurality of analog-to-digital converters (ADCs) able to, according to a sequence, sample an analog input signal and produce digital outputs, the method comprising:
   determining a first order information associated with a first digital output from a first ADC of the plurality of ADCs;
   determining a first error coefficient associated with the first digital output based on the first order information; and
   calibrating the time-interleaved analog-to-digital converter using the first error coefficient.

2. The method of claim 1, wherein the order information indicates at least one of the plurality of ADCs having a position in the sequence preceding a position of the first ADC in the sequence.

3. The method of claim 1, wherein the order information indicates at least one of the plurality of ADCs having a position in the sequence after a position of the first ADC in the sequence.

4. The method of claim 1, wherein the order information indicates at least one of the plurality of ADCs having a position in the sequence preceding a position of the first ADC in the sequence, and at least one of the plurality of ADCs having a position in the sequence after a position of the first ADC in the sequence.

5. The method of claim 1, further comprising:
   determining a second order information associated with a second digital output from a second ADC of the plurality of ADCs, wherein the second order information is different from the first order information;
   determining a second error coefficient associated with the second digital output based on the second order information; and
   calibrating the time-interleaved analog-to-digital converter using the second error coefficient.

6. The method of claim 1, wherein determining the first error coefficient comprises obtaining, from an error coefficient block storing error coefficients organized by order information, an error coefficient corresponding to the first order information associated with the first ADC using the first order information.

7. The method of claim 1, wherein the sequence corresponds to a pseudo-random sequence, and the time-interleaved ADC is a randomized time-interleaved ADC.

8. The method of claim 1, wherein the first error coefficient corresponds to a mismatch error of the first ADC with respect to one or more other ADCs in the plurality of ADCs.

9. The method of claim 8, wherein the mismatch error includes one or more of the following: offset error, gain error, timing skew error, bandwidth error, integral non-linearity error, and differential non-linearity error.

10. The method of claim 1, wherein the plurality of ADCs includes three or more ADCs able to, in any chosen sequence, sample the analog input signal and produce digital outputs.

11. The method of claim 1, wherein calibrating the time-interleaved analog-to-digital converter comprises:
performing error calibration of the first digital output using the first error coefficient by adjusting the first digital output by the first error coefficient to correct for order-dependent errors.

12. The method of claim 1, wherein calibrating the time-interleaved analog-to-digital converter comprises:
performing error calibration of the first digital output using the first error coefficient by adjusting a coefficient of the first ADC to compensate for order-dependent errors.

13. An apparatus for reducing order-dependent errors of a time-interleaved analog-to-digital converter comprising a plurality of analog-to-digital converters (ADCs) able to, according to a sequence, sample an analog input signal and produce digital outputs, the apparatus comprising:
means for determining a first order information associated with a first digital output from a first ADC of the plurality of ADCs;
means for determining a first error coefficient associated with the first digital output based on the first order information; and
means for calibrating the time-interleaved analog-to-digital converter using the first error coefficient.

14. The apparatus of claim 13, wherein the order information indicates at least one of the plurality of ADCs having a position in the sequence preceding a position of the first ADC in the sequence.

15. The apparatus of claim 13, wherein the order information indicates at least one of the plurality of ADCs having a position in the sequence preceding a position of the first ADC in the sequence.

16. The apparatus of claim 13, wherein the order information indicates at least one of the plurality of ADCs having a position in the sequence preceding a position of the first ADC in the sequence, and at least one of the plurality of ADCs having a position in the sequence after a position of the first ADC in the sequence.

17. The apparatus of claim 13, wherein the means for calibrating the time-interleaved analog-to-digital converter comprises:
means for digitally adjusting the first digital output of the first ADC based on the first error coefficient.

18. A time-interleaved analog-to-digital converter configured for reducing order-dependent errors, the time-interleaved ADC comprising:
a plurality of analog-to-digital converters (ADCs) to, according to a sequence, sample an analog input signal and produce digital outputs;
a clock generator to generate selection signals corresponding to the sequence and provide order information to a digital block; and
the digital block to:
estimate errors for different order information;
obtain, from an error coefficients block, a first error coefficient associated with a first digital output of a first ADC of the plurality of ADCs based on order information corresponding to the first digital output; and
adjust the first digital output of the first ADC using the first error coefficient.

19. The time-interleaved analog-to-digital converter of claim 18, wherein the sequence corresponds to a pseudo-random sequence, and the time-interleaved ADC is a randomized time-interleaved ADC.

20. The time-interleaved ADC of claim 18, wherein the plurality of ADCs includes three or more ADCs to, in any chosen sequence, sample the analog input signal and produce digital outputs.

21. The apparatus of claim 13, wherein the means for calibrating the time-interleaved analog-to-digital converter comprises:
means for converting the first error coefficient into an analog value via a feedback digital-to-analog converter; and
means for injecting the analog value into an analog domain of the time-interleaved analog-to-digital converter via an error compensation feedback path.

22. The time-interleaved analog-to-digital converter of claim 18, wherein:
the digital block, when adjusting the first digital output of the first ADC, is configured to convert the first error coefficient into an analog value via a feedback digital-to-analog converter; and
the time-interleaved ADC further comprises an error compensation feedback path to adjust a coefficient of the first ADC based on the analog value to compensate for an order-dependent error in an analog domain of the time-interleaved analog-to-digital converter.

23. The time-interleaved analog-to-digital converter of claim 18, wherein the digital block comprises:
the error coefficients block to store error coefficients organized based on order information, wherein the error coefficients are separately associated with different selection patterns.

24. The time-interleaved analog-to-digital converter of claim 18, wherein the digital block comprises:
an error estimator to estimate the errors using the order information from the clock generator and store error coefficients in the error coefficients block organized based on the order information.

* * * * *